(12) United States Patent
Kim

(10) Patent No.: US 7,473,601 B2
(45) Date of Patent: Jan. 6, 2009

(54) METHOD OF FABRICATING FLASH MEMORY DEVICE USING SIDEWALL PROCESS

(76) Inventor: Jae Young Kim, #1417-503 Mokdong Apt., Sinjeong-dong, Yangcheon-gu, Seoul 158-070 (KR)

( * ) Notice: Subject to any disclaimer, the term of this patent is extended or adjusted under 35 U.S.C. 154(b) by 0 days.

(21) Appl. No.: 11/766,758

(22) Filed: Jun. 21, 2007

(65) Prior Publication Data

US 2007/0243681 A1    Oct. 18, 2007

Related U.S. Application Data

(62) Division of application No. 10/913,474, filed on Aug. 9, 2004, now abandoned.

(30) Foreign Application Priority Data

Aug. 8, 2003    (KR)    ................ 10-2003-0054837

(51) Int. Cl.
*H01L 21/336* (2006.01)
(52) U.S. Cl. ................... 438/257; 257/E21.69
(58) Field of Classification Search ......... 438/257–267; 257/314–321, E21.68, E21.679, E21.681, 257/E21.69
See application file for complete search history.

(56) References Cited

U.S. PATENT DOCUMENTS

| | | | | |
|---|---|---|---|---|
| 3,997,367 | A | * | 12/1976 | Yau ........................ 438/374 |
| 5,702,965 | A | | 12/1997 | Kim |
| 6,093,945 | A | * | 7/2000 | Yang ........................ 257/317 |
| 6,261,903 | B1 | | 7/2001 | Chang et al. |
| 6,284,597 | B1 | | 9/2001 | Hong |
| 6,420,234 | B1 | | 7/2002 | Park et al. |
| 6,501,125 | B2 | | 12/2002 | Kobayashi |
| 6,605,506 | B2 | | 8/2003 | Wu |
| 6,635,533 | B1 | * | 10/2003 | Chang et al. ............. 438/259 |
| 6,706,592 | B2 | | 3/2004 | Chern et al. |
| 6,773,993 | B2 | | 8/2004 | Lin et al. |
| 6,800,525 | B2 | | 10/2004 | Ryu et al. |
| 2002/0187609 | A1 | | 12/2002 | Kim et al. |
| 2004/0043638 | A1 | | 3/2004 | Nansei et al. |
| 2004/0166641 | A1 | | 8/2004 | Hung et al. |

FOREIGN PATENT DOCUMENTS

| | | |
|---|---|---|
| JP | 63318164 | 12/1988 |
| JP | 06-204495 | 7/1994 |
| JP | 07-130884 | 5/1995 |
| JP | 2002-190536 | 7/2002 |
| JP | 2003-282741 | 10/2003 |

* cited by examiner

*Primary Examiner*—Brook Kebede
(74) *Attorney, Agent, or Firm*—Sherr & Vaughn, PLLC

(57) ABSTRACT

A method of fabricating a flash memory device includes depositing and etching an insulating layer on a substrate having STI structures, depositing a first polysilicon layer over the insulating layer and the substrate, etching the first polysilicon layer to form floating gates and removing the insulating layer. The method also includes forming a first photoresist pattern, performing a first ion implantation using the first photoresist pattern to form first source/drain regions in the substrate and adjacent to the floating gate, removing the first photoresist pattern, depositing an ONO layer on the resulting structure, depositing a second polysilicon layer over the ONO layer, and etching the second polysilicon layer to form a control gate and at least one select gate. The method concludes by forming a second photoresist pattern and performing a second ion implantation using the second photoresist pattern to form second source/drain regions in the substrate and adjacent to the select gate.

10 Claims, 5 Drawing Sheets

METHOD OF FABRICATING FLASH MEMORY DEVICE USING SIDEWALL PROCESS

RELATED ART

This application is a divisional of U.S. patent application Ser. No. 10/913,474, filed Aug. 9, 2004, now abandoned, which is based on and claims benefit of priority to Korean Patent Application No. 10-2003-0054837, filed on Aug. 8, 2003. The entire contents of these related applications are incorporated herein by reference.

BACKGROUND OF THE INVENTION

1. Field of the Invention

The present invention relates to a method for manufacturing a semiconductor device and, more particularly, to a method of fabricating a floating gate of a flash memory cell using a sidewall process.

2. Background of the Related Art

Generally, a flash memory cell having an EEPROM (electrically erasable programmable read-only memory) tunnel oxide structure comprises a floating gate which is formed over an active area of a semiconductor substrate and is electrically isolated from the semiconductor substrate by a gate oxide layer, where the substrate has device on formed thereon, a control gate which is formed over the floating gate and is electrically isolated from the floating gate by a dielectric layer, and a source/drain region which is formed at both sides of the floating gate on the semiconductor substrate. The device isolation structure is made by a shallow trench isolation (STI) process or LOCOS (local oxidation of silicon) process.

Conventional technology forms a nitride capping layer as a hard mask by using bottom, anti-reflective coating and then performs a polysilicon etching process to fabricate a floating gate because of a difference in height between a field region and a moat region and bad reflection characteristics of a polysilicon layer. The technology has difficulty in controlling a critical dimension (CD), and causes excessive polysilicon loss while etching the nitride capping layer. Moreover, the excessive polysilicon loss may cause a bad profile and a moat pit in a later polysilicon etching process.

FIG. 1 illustrates, in a cross-sectional view, the structure of a flash memory device according to the conventional technology. As shown in FIG. 1, the conventional flash memory device comprises at least one floating gate 1 formed over a substrate, a control gate 2 covering the floating gate 1, and select gates 3, which are positioned on both sides of the control gate 2. One control gate operates two transistors, which increases the size of a cell device.

U.S. Pat. No. 6,605,506 to Wu discloses a method of fabricating a scalable stacked-gate flash memory device and its high-density memory arrays. The method uses four different spacer techniques to fabricate a scalable stacked-gate flash memory device. The first spacer technique is used to form buffer-oxide spacers. The second spacer technique is used to highly adjust the coupling ratio of the self-aligned floating gate using an STI structure. The third spacer is used to define the gate length of a scalable stacked-gate structure. The fourth spacer technique is used to form the sidewall spacers for self-aligned source/drain implant, self-aligned source/drain or common buried-source silicidation, and self-aligned contacts.

U.S. Pat. No. 6,501,125 to Kobayashi describes a method of manufacturing a semiconductor device which can solve the problem that a memory cell size determines a write/erase speed of memory cell transistors and can increase the write/erase speed without the reduction in the reliability of an insulating film between a control gate and a second-layer floating gate.

U.S. Pat. No. 6,261,903 to Chang et al. provides a integrated circuit device having a flash memory cell. In Chang et al., the flash memory cell has a tunnel dielectric layer overlying a surface of a semiconductor substrate and a floating gate layer defined overlying the tunnel dielectric layer. The gate layer has an edge and a sidewall spacer extends along and on the edge. The combination of the sidewall spacer and the gate layer provide a surface for increasing gate coupling ratio.

U.S. Pat. No. 5,702,965 to Kim discloses a split-gate type flash memory cell with an insulation spacer of ONO (oxide-nitride-oxide) or ON (oxide-nitride) structure formed at the sidewalls of the floating gate. The cell is said to improve program and erasure capabilities of the cell by preventing reduction of the coupling ratio and leakage of electrons through the floating gate and the control gate.

SUMMARY OF THE INVENTION

Accordingly, the present invention provides a method of fabricating a flash memory, comprising the steps of depositing and etching an insulating layer on a substrate having STI structures, depositing a first polysilicon layer over the insulating layer and the substrate, etching the first polysilicon layer to form floating gates, removing the insulating layer, forming a first photoresist pattern, performing a first ion implantation using the first photoresist pattern to form first source/drain regions in the substrate and adjacent to the floating gate, removing the first photoresist pattern, depositing an ONO layer on the resulting structure, depositing a second polysilicon layer over the ONO layer, etching the second polysilicon layer to form a control gate and at least one select gate, forming a second photoresist pattern, and performing a second ion implantation using the second photoresist pattern to form second source/drain regions in the substrate and adjacent to the select gate.

Both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and, together with the description, explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
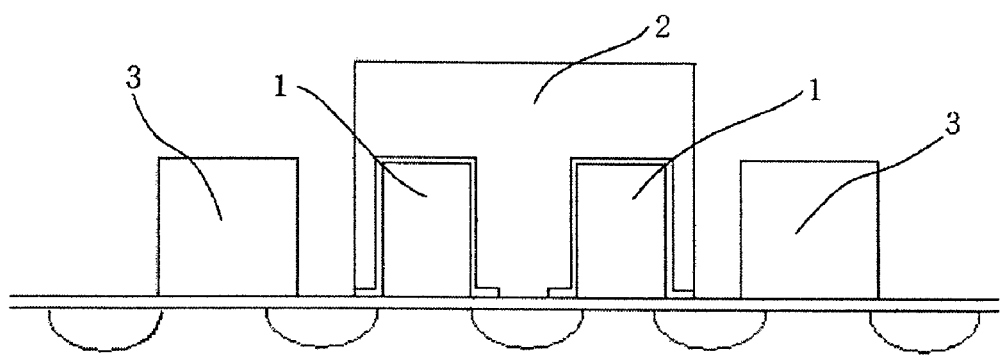
FIG. 1 illustrates, in a cross-sectional view, the structure of a conventional flash memory cell.
Figure 2:
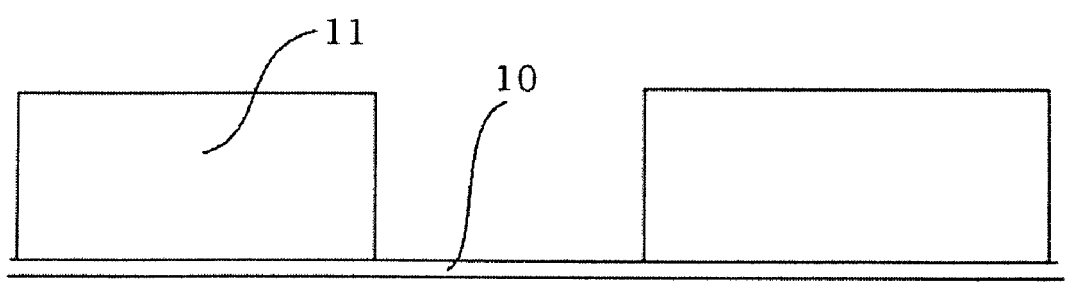
FIG. 2 illustrates a cross-sectional view of a step of the process of fabricating a flash memory cell according to the present invention.

FIG. 2 shows a cross-sectional view of a step of the process of fabricating a flash memory cell according to the present invention. In FIG. 2, a gate oxide layer 10 is deposited over a substrate, where the substrate includes one or more shallow trench isolations (STIs, not shown) formed therein. An insulating layer 11 is deposited over the gate oxide layer 10. Then, some part of the insulating layer 11 is removed to form one or more trenches (only one trench is shown) therein so that a predetermined portion of the gate oxide layer 10 can be exposed. The thickness of the insulating layer 11 is between 2000 Å and 3000 Å, preferably 2500 Å.

Figure 3:
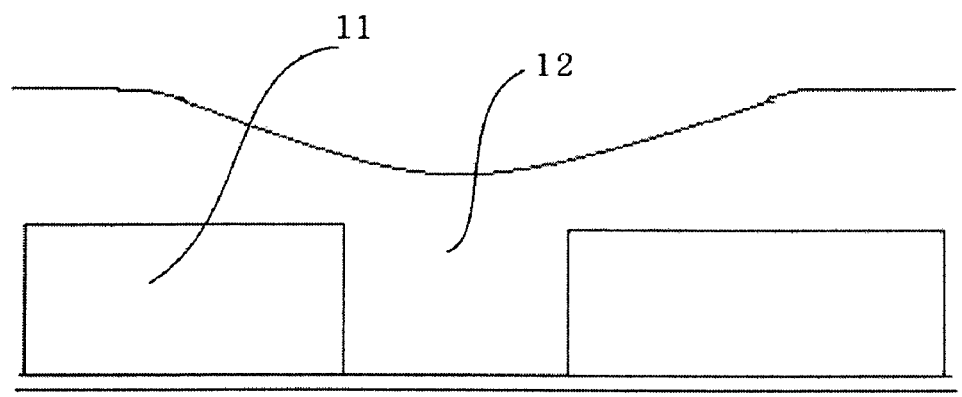
FIG. 3 illustrates a cross-sectional view of a subsequent step of the process of fabricating a flash memory cell according to the present invention.

FIG. 3 shows a cross-sectional view of a subsequent step of the process of fabricating a flash memory cell according to the present invention. In FIG. 3, a polysilicon layer 12 to make at least one floating gate is deposited over the insulating layer and in the trench. Here, the thickness of the deposited polysilicon layer 12 is between 4000 Å and 6000 Å, preferably 5000 Å.

Figure 4:
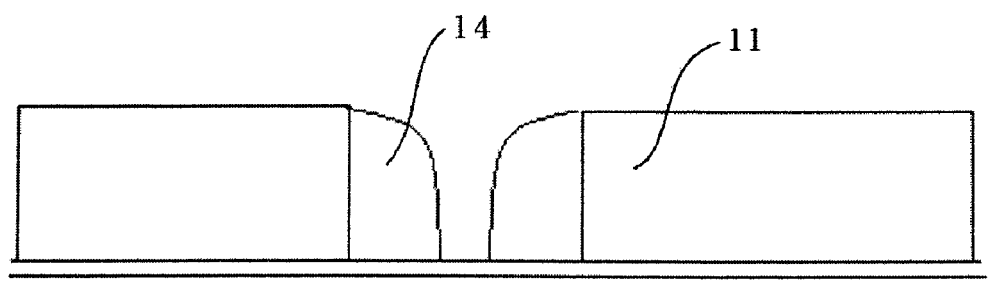
FIG. 4 illustrates a cross-sectional view of a subsequent step of the process of fabricating a flash memory cell according to the present invention.

FIG. 4 shows a cross-sectional view of a subsequent step of the process of fabricating a flash memory cell according to the present invention. In FIG. 4, the polysilicon layer 12 is etched without a mask to form polysilicon sidewalls 14 on the side surfaces of the insulating layer 11. Polysilicon sidewalls 14 serve as floating gates. When the polysilicon layer is etched without a mask, some polysilicon in the trench still remains on the side surfaces of the insulating layer 11 after the polysilicon over the insulating layer is completely removed due to the topology difference of the deposited polysilicon layer. Therefore, the polysilicon sidewalls are formed on the side surfaces of the trench.

Figure 5:
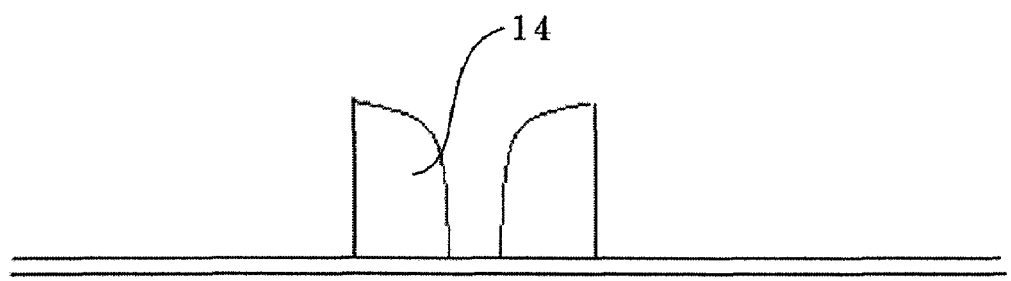
FIG. 5 illustrates a cross-sectional view of a subsequent step of the process of fabricating a flash memory cell according to the present invention.

FIG. 5 shows a cross-sectional view of a subsequent step of the process of fabricating a flash memory cell according to the present invention. In FIG. 5, the insulating layer is removed to leave only the polysilicon sidewalls 14. The polysilicon sidewalls 14 are used as floating gates in the later process.

Figure 6:
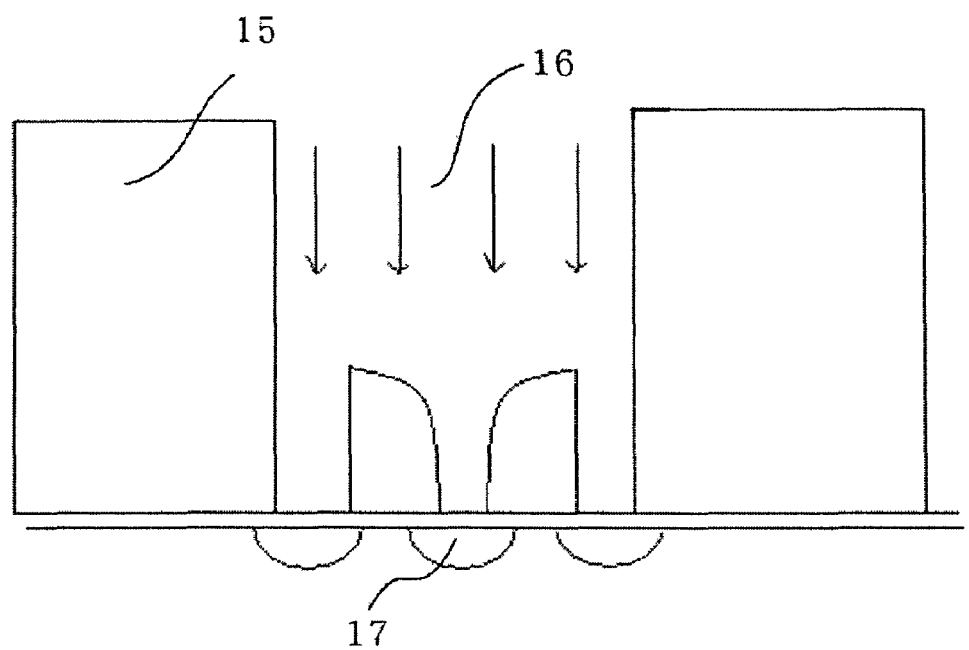
FIG. 6 illustrates a cross-sectional view of a subsequent step of the process of fabricating a flash memory cell according to the present invention.

FIG. 6 illustrates a cross-sectional view of a subsequent step of the process of fabricating a flash memory cell according to the present invention. In FIG. 6, a first photoresist pattern 15 is formed over the resulting substrate. A first ion implantation 16 is then performed using the first photoresist pattern 15 as a mask to form source/drain regions 17 in the substrate and adjacent to the floating gates 14. Next, the first photoresist pattern 15 is removed.

Figure 7:
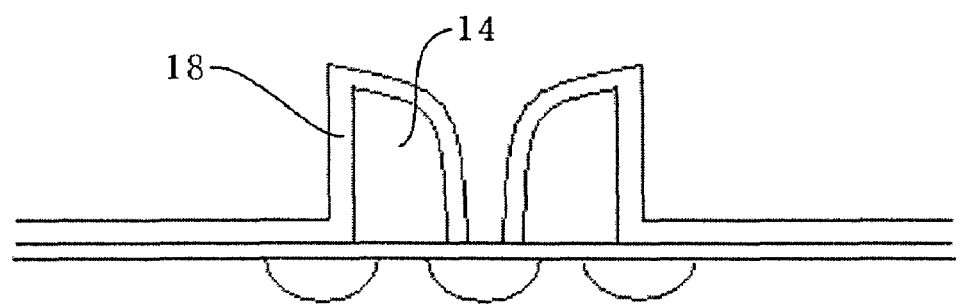
FIG. 7 illustrates a cross-sectional view of a subsequent step of the process of fabricating a flash memory cell according to the present invention.

FIG. 7 illustrates a cross-sectional view of a subsequent step of the process of fabricating a flash memory cell according to the present invention. In FIG. 7, an oxide-nitride-oxide (ONO) layer 18 is formed on the floating gates and the substrate. The ONO layer 18 consists of a first oxide layer (not shown), a nitride layer (not shown), and a second oxide layer (not shown). The thickness of the first oxide layer is between 50 Å and 100 Å, preferably 80 Å. The thickness of the nitride layer is between 50 Å and 100 Å, preferably 80 Å. The thickness of second oxide layer is between 300 Å and 400 Å, preferably 350 Å.

Figure 8:
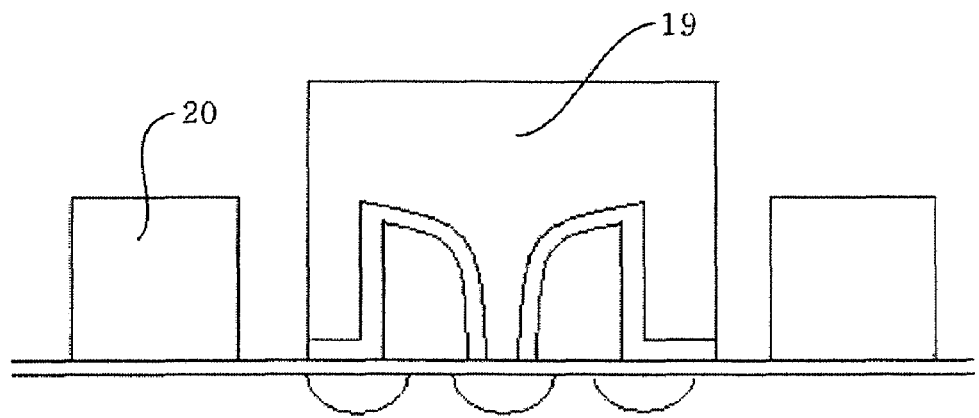
FIG. 8 illustrates a cross-sectional view of a subsequent step of the process of fabricating a flash memory cell according to the present invention.

FIG. 8 illustrates a cross-sectional view of a subsequent step of the process of fabricating a flash memory cell according to the present invention. In FIG. 8, a second polysilicon layer is deposited over the ONO layer 18. The thickness of the deposited second polysilicon layer is between 1500 Å and 2500 Å, preferably 2000 Å. The second polysilicon layer is etched by using a predetermined mask pattern to form a control gate 19 and at least one select gate 20.

Figure 9:
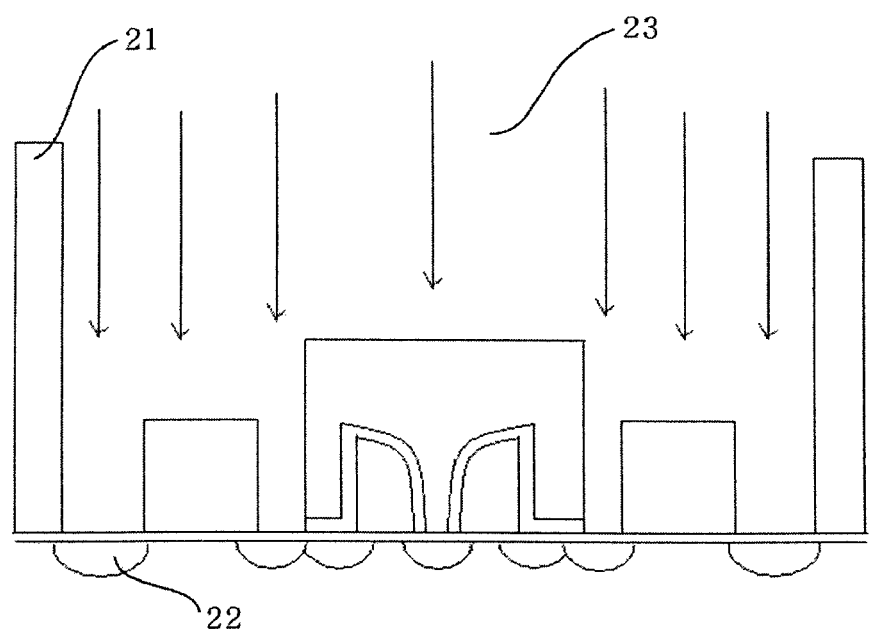
FIG. 9 illustrates a cross-sectional view of a subsequent step of the process of fabricating a flash memory cell according to the present invention.

FIG. 9 illustrates a cross-sectional view of a subsequent step of the process of fabricating a flash memory cell according to the present invention. In FIG. 9, a second photoresist pattern 21 is formed over the resulting substrate. A second ion implantation 23 is performed using the second photoresist pattern 21 as a mask to form source/drain regions 22 in the substrate and adjacent to the select gate.

Figure 10:
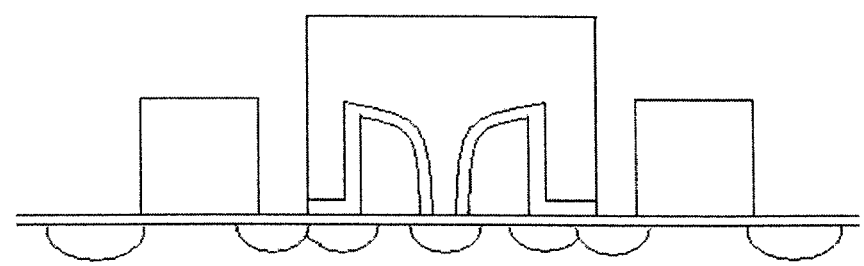
FIG. 10 illustrates a cross-sectional view of a subsequent step of the process of fabricating a flash memory cell according to the present invention.

FIG. 10 illustrates a cross-sectional view of a subsequent step of the process of fabricating a flash memory cell according to the present invention. In FIG. 10, the second photoresist pattern 21 is removed and a flash memory device is completed.

The disclosed method can reduce the unit production cost because it does not need to use a nitride capping layer as a hard mask and can omit pattern processes by forming floating gates using a sidewall process. In addition, this method can easily control the CD because it does not use the nitride capping layer as a hard mask for etching the floating gate, and prevents the formation of a moat pit while etching the floating gate. Moreover, the disclosed method can reduce the size of a flash memory device because it makes the floating gate using the sidewall process.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A Method of fabricating a flash memory device using a sidewall process comprising:

depositing an insulating layer on a substrate;

forming at least one trench in the insulating layer by etching the insulating layer;

depositing a first polysilicon layer over and in said at least one trench;

forming floating gates on side surfaces of the insulating layer by etching the first polysilicon layer;

removing the insulating layer;

forming a first photoresist pattern over the substrate;

forming first source/drain regions in the substrate adjacent to the floating gate by a first ion implantation using the first photoresist pattern as a mask;

removing the first photoresist pattern depositing an oxide-nitride-oxide (ONO) layer over the substrate;

depositing a second polysilicon layer over the ONO layer;

forming a control gate and at least one select gate by etching the second polysilicon layer;

forming a second photoresist pattern over the control gate and the select gate; and then forming second source/drain regions in the substrate adjacent to the select gate by a second ion implantation using the second photoresist pattern as a mask.

2. The method of claim 1, wherein the ONO layer comprises a first oxide layer with a thickness between about 50 Å and about 100 Å, a nitride layer with a thickness between about 50 Å and about 100 Å, and a second oxide layer with a thickness between about 300 Å and about 400 Å.

3. The method of claim 1, wherein the second polysilicon layer has a thickness between about 1500 Å and about 2500 Å.

4. The method of claim 1, wherein the control gate and the select gate are formed simultaneously during the etching of the second polysilicon layer.

5. The method of claim 1, wherein the first ion implantation is performed after the floating gates are formed.

6. The method of claim 1, wherein the first polysilicon layer is etched to form polysilicon sidewalls that serve as the floating gates on side surfaces of the trench.

7. The method of claim 1, wherein the insulating layer has a thickness between about 2000 Å and about 3000 Å.

8. The method of claim 1, wherein the first polysilicon layer has a thickness between about 4000 Å and about 6000 Å.

9. The method of claim 1, wherein the first polysilicon layer is etched without a mask pattern to form the floating gates.

10. The method of claim 1, wherein the insulating layer is removed by wet-etching after formation of the floating gates.

* * * * *